United States Patent
Cromwell et al.

(10) Patent No.: US 6,930,884 B2
(45) Date of Patent: Aug. 16, 2005

(54) LAND GRID ARRAY ASSEMBLY USING A COMPRESSIVE LIQUID

(75) Inventors: Stephen D. Cromwell, Penryn, CA (US); Thomas J. Augustin, El Dorado Hills, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/458,296

(22) Filed: Jun. 11, 2003

(65) Prior Publication Data

US 2004/0252462 A1 Dec. 16, 2004

(51) Int. Cl.[7] .......................... H05K 7/20; H01L 23/40
(52) U.S. Cl. ...................... 361/710; 361/709; 361/719; 361/702; 257/718; 257/719
(58) Field of Search ................................. 361/696, 697, 361/701–704, 709, 710, 717–719; 257/705–707, 713, 717–719

(56) References Cited

U.S. PATENT DOCUMENTS

| | | | | |
|---|---|---|---|---|
| 5,648,890 A | * | 7/1997 | Loo et al. .................... | 361/704 |
| 5,691,041 A | * | 11/1997 | Frankeny et al. ........... | 428/209 |
| 5,770,891 A | * | 6/1998 | Frankeny et al. ........... | 257/727 |
| 5,923,959 A | * | 7/1999 | Mess .......................... | 438/126 |
| 6,061,235 A | | 5/2000 | Cromwell et al. | |
| 6,198,630 B1 | | 3/2001 | Cromwell | |
| 6,330,745 B1 | | 12/2001 | Cromwell et al. | |
| 6,386,890 B1 | * | 5/2002 | Bhatt et al. .................... | 439/67 |
| 6,400,577 B1 | * | 6/2002 | Goodwin et al. ........... | 361/816 |
| 6,449,162 B1 | * | 9/2002 | Corbin et al. ............... | 361/719 |
| 6,472,252 B2 | * | 10/2002 | Mess .......................... | 438/126 |
| 6,475,011 B1 | * | 11/2002 | Sinha et al. ................. | 439/330 |
| 6,557,675 B2 | * | 5/2003 | Iannuzzelli .................. | 188/380 |
| 6,702,587 B2 | * | 3/2004 | Weiss et al. .................. | 439/66 |
| 6,743,026 B1 | * | 6/2004 | Brodsky ...................... | 439/73 |
| 2003/0032310 A1 | * | 2/2003 | Weiss et al. .................. | 439/66 |

FOREIGN PATENT DOCUMENTS

JP        07007109 A  *  1/1995  ........... H01L/23/40

* cited by examiner

*Primary Examiner*—Anatoly Vortman

(57) ABSTRACT

Disclosed is land grid array (LGA) assembly using a compressive load. An LGA assembly includes a first component located on the top of the LGA assembly; a center load screw coupled to the first component; and a second component, wherein the center load screw is received on the second component upon turning the center load screw in a first direction. Further turning of the center load screw in the first direction after the center load screw is received on the second component, operates the first component to apply a compressive load within the LGA assembly.

23 Claims, 4 Drawing Sheets

LAND GRID ARRAY ASSEMBLY USING A COMPRESSIVE LIQUID

TECHNICAL FIELD

The technical field is integrated circuit packaging, specifically land grid array assembly using a compressive load.

BACKGROUND

The use of increasingly high speed integrated circuits (ICs) in computer systems has given rise to new assembly challenges related to the attachment and support of the ICs. Due to the large, thermally induced stresses that impact the long term reliability of solder joints, high speed, high density IC module assemblies can not employ standard solder techniques for connecting modules to a circuit board. Therefore, interposer socket assembly techniques, specifically land grid array (LGA) sockets, have emerged as a substitute for solder joints.

An LGA socket is placed on the circuit board and makes electrical contact with the circuit board through a plurality of input/output (IO) interconnects. An IC module is placed on the LGA socket in electrical contact so that the LGA socket enables electrical connection between the IC module and the circuit board. Assemblies using LGA sockets require mechanisms for applying compressive load on the assembly such that the LGA socket establishes and maintains reliable electrical connection with the circuit board, thereby ensuring reliable electrical connection between the IC module and the circuit board.

Coil spring assemblies are widely used in the art for applying a compressive load on LGA assemblies. Typically, a coil spring assembly includes an anchor screw, a spring, one or more washers to eliminate metal debris and a clip to capture the screw to a heat sink. The spring may be compressed as the anchor screw is tightened. The coil spring assemblies may be located along the perimeter of the LGA assembly. Compressive load is derived from the coil spring assemblies and spread across a heat sin and applied to the LGA assembly.

Prior art systems utilizing coil spring assemblies are limited. Large loads are difficult to achieve with load systems utilizing coil spring assemblies. Systems using coil spring assemblies are also difficult to manufacture. The anchor screw of each coil spring assembly must be tightened to apply a compressive load. Each anchor screw must be tightened individually before moving on to another anchor screw located in a corresponding opposite direction. In order to apply an even compressive load on the LGA assembly, the anchor screws must be sequentially tightened in a series of repetitive steps performed in a cross pattern configuration. Typically, three or more repetitions of each cross pattern are required. For example, if four coil spring assemblies are used in a system, twelve or more repeated operations may be required. Additionally, systems using coil spring assemblies are susceptible to unevenly applied loads on the LGA socket. Transverse loads may be created that interfere with the alignment of the processor to the LGA socket. Further, conventional coil spring assemblies typically involve a high part count. For example, a coil spring assembly may comprise a screw, a spring, one or more washers and a clip to capture the screw to a heat sink. The increased part Count may result in increased assembly time and costs. Further, systems using coil spring assemblies suffer from impeded thermal performance. Typically, a heat sink is used to dissipate heat generated by the IC module. The heat sink typically comprises a plurality of fins exposed to the ambient air. In order to make space for the coil spring assemblies (i.e. footprint), a significant amount of fin area must be removed from the heat sink, thereby reducing the performance of the heat sink. The coil spring assemblies may also create an obstruction to airflow in the heat sink.

SUMMARY

Disclosed is a land grid array (LGA) assembly using a compressive load comprising a first component located on the top of the LGA assembly; a center load screw coupled to the first component; and a second component, wherein the center load screw is received on the second component upon turning the center load screw in a first direction. Further turning of the center load screw in the first direction after the center load screw is received on the second component, operates the first component to apply a compressive load on one or more of a plurality of components of the LGA assembly.

Also disclosed is a method for LGA assembly using a compressive load, comprising the steps of setting a first component on the top of the LGA assembly; coupling a center load screw to the first component; setting a second component, wherein the center load screw is received on the second component upon turning the center load screw in a first direction; and turning the center load screw in the first direction, wherein the center load screw is received on the second component and the first component is operated to apply a compressive load on one or more of a plurality of components of the LGA assembly.

Other aspects and advantages will become apparent from the following detailed description, taken in conjunction with the accompanying figures.

DESCRIPTION OF THE DRAWINGS

The detailed description will refer to the following drawings, wherein like numerals refer to like elements, and wherein.

DETAILED DESCRIPTION

Figure 1:
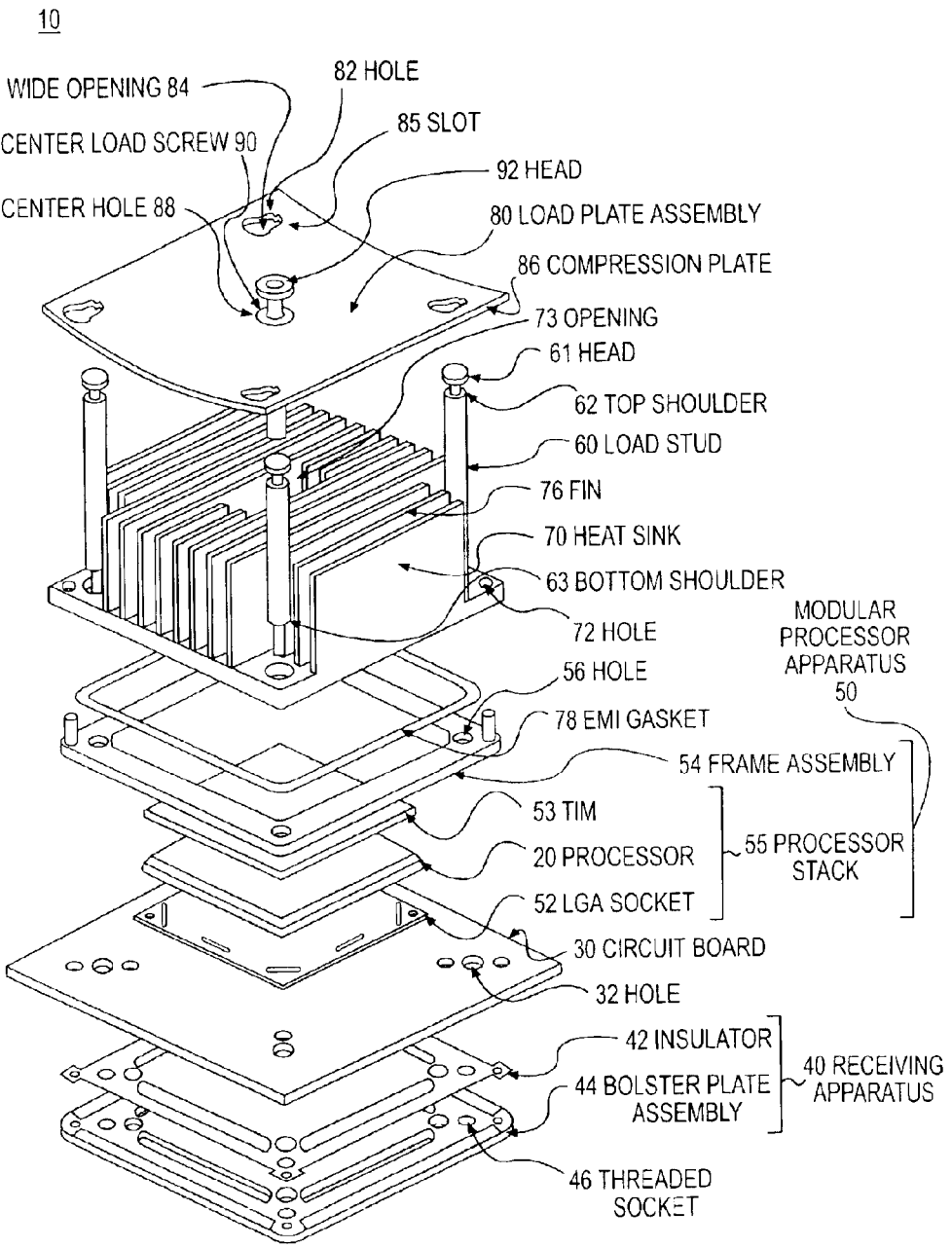
FIG. 1 is an exploded diagram of a modular integrated apparatus.
Figure 2:
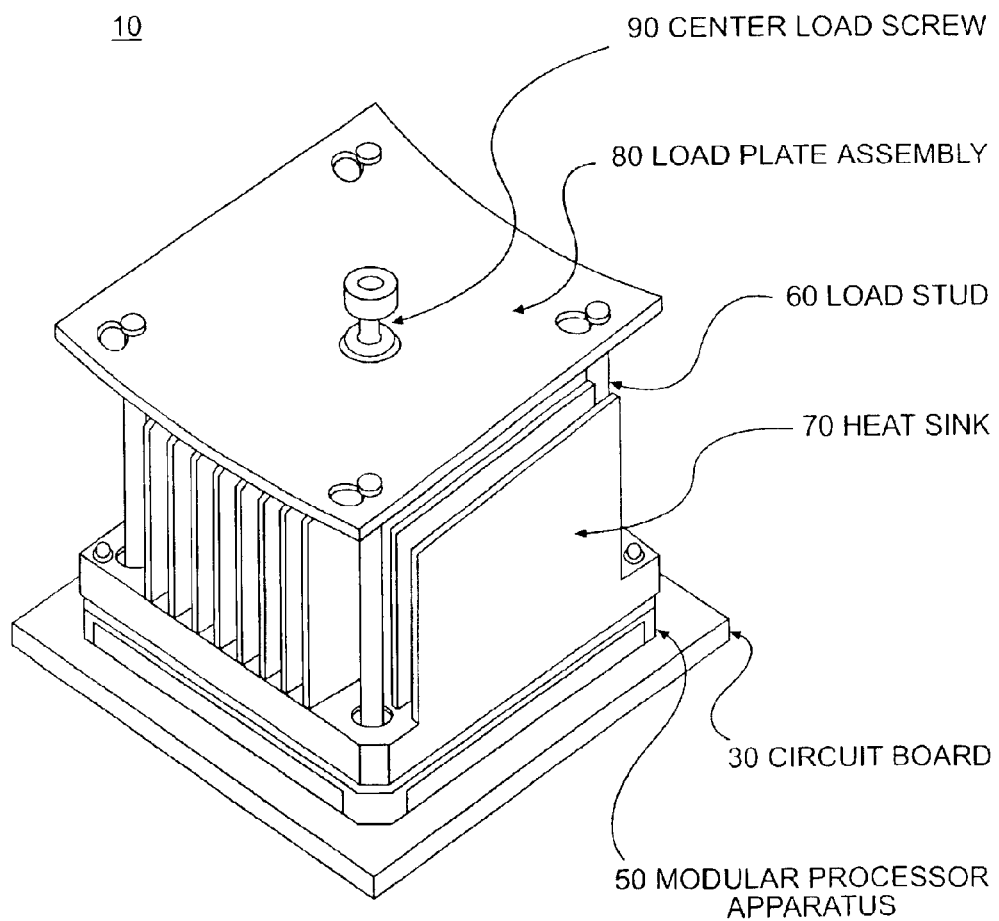
FIG. 2 is a diagram of the modular integrated apparatus assembled.

FIG. 1 is an exploded diagram of a modular integrated apparatus 10 for a computer system. FIG. 2 is a diagram of the modular integrated apparatus 10 assembled. The modular integrated apparatus 10 comprises a plurality of components described below and forms an infrastructure for a clamped attachment of a processor 20 to a circuit board 30 through compressive load applied to the modular integrated apparatus 10. The processor 20 may be an integrated circuit module such as, for example, a multi-chip module or a single VLSI package. The VLSI package may be a flip chip assembly. The processor 20 may also be an application specific integrated circuit (ASIC). The circuit board 30 may be, for example, a printed circuit board such as a mother board. Only a section of the circuit board 30 is shown in FIGS. 1 and 2.

A receiving apparatus 40 comprises an insulator 42 and a bolster plate assembly 44. The receiving apparatus 40 is set on a bottom surface of the circuit board 30. The bolster plate assembly 44 may be attached to the circuit board 30. The bolster plate assembly 44 comprises a plurality of threaded sockets 46 located along a perimeter of the bolster plate assembly 44. For example, if the bolster plate assembly 44 is rectangular in shape, the threaded sockets 46 may be located at the four corners of the rectangular shape. The circuit board 30 comprises a plurality of holes 32 corresponding to the location of the threaded sockets 46 in the bolster plate assembly 44. The insulator 42 is set over the bolster plate assembly 44 in between the bolster plate assembly 44 and the circuit board 30. The insulator 42 creates insulation between a plurality of input/output (IO) pads (not shown) that are located on the bottom surface of the circuit board 30. The insulator 42 prevents short circuiting between the IO pads.

A modular processor apparatus 50 comprises a processor stack 55 and a frame assembly 54. The modular processor apparatus 50 is set on a top surface of the circuit board 30 over the receiving apparatus 40. The processor stack 55 comprises a land grid array (LGA) socket 52, the processor 20 and a thermal interface material (TIM) 53. The TIM 53 comprises a thermal interface enhancement material for enhancing thermal conduction from the processor 20 to a heat sink. The TIM 53 is set on a top face of the processor 20. The processor 20 is located on a top surface of the LGA socket 52. The LGA socket 52 enables electrical connection between the processor 20 and the circuit board 30. The LGA socket 52 comprises a plurality of IO interconnect elements (not shown) that make contact with the circuit board 30. In order to establish and maintain a reliable electrical connection between the processor 20 and the circuit board 30, the LGA socket 52 must be sufficiently compressed between the circuit board 30 and the processor 20. The receiving apparatus 40 may drive the orientation and alignment for the modular processor apparatus 50 in relation to the circuit board 30. Additionally, separate and distinct features may be used for the orientation and alignment of the LGA socket 52 to the circuit board 30 and the processor 20 to the LGA socket 52.

The processor stack 55 fits into an opening of the frame assembly 54, which may be, for example, rectangular in shape. The frame assembly 54 may be designed, for example, to attenuate electromagnetic interference (EMI) generated by the processor 20. The frame assembly 54 comprises a plurality of holes 56 corresponding to the location of the threaded sockets 46 in the bolster plate assembly 44. Optionally, the frame assembly 54 may align the processor stack 55 in relation to the circuit board 30 and the bolster plate assembly 44. The frame assembly 54 and the LGA socket 52 lie on the top surface of the circuit board 30.

A plurality of load studs 60 are inserted through the holes 56 of the frame assembly 54, the holes 32 in the circuit board 30, and are threaded into the sockets 46 of the bolster plate assembly 44. Each load stud 60 comprises a head 61, a top shoulder 62 and a bottom shoulder 63. Each load stud 60 bottoms out on the top surface of the frame assembly 54 at the bottom shoulder 63. The load studs 60 are threaded and may be, for example, long screws.

A heat sink 70 is set over the load studs 60 through a plurality of holes 72 located along a perimeter of the heat sink 70. The holes 72 correspond to the location of the threaded sockets 46 in the bolster plate assembly 44. The heat sink 70 is located on top of and in contact with the modular processor apparatus 50. The heat sink 70 comprises an opening 73. The heat sink 70 may, for example, comprise a plurality of fins 76 that provide a surface area for distributing heat generated from the processor 20. Heat that is generated in processor 20 may be thermally conducted into the heat sink 70 and further conducted into the ambient airflow by the fins 76 to dissipate the heat. The heat sink 70 may, for example, be comprised of aluminum. Optionally, an EMI gasket 78 may be placed between the heat sink 70 and the frame assembly 54 to further attenuate EMI generated by the processor 20. Further, additional EMI gaskets may be placed between the circuit board 30 and the frame assembly 54 and between the circuit board 30 and the bolster plate assembly 44 for further EMI attenuation. The load of the heat sink 70 is primarily born by the processor stack 55.

Figure 3:
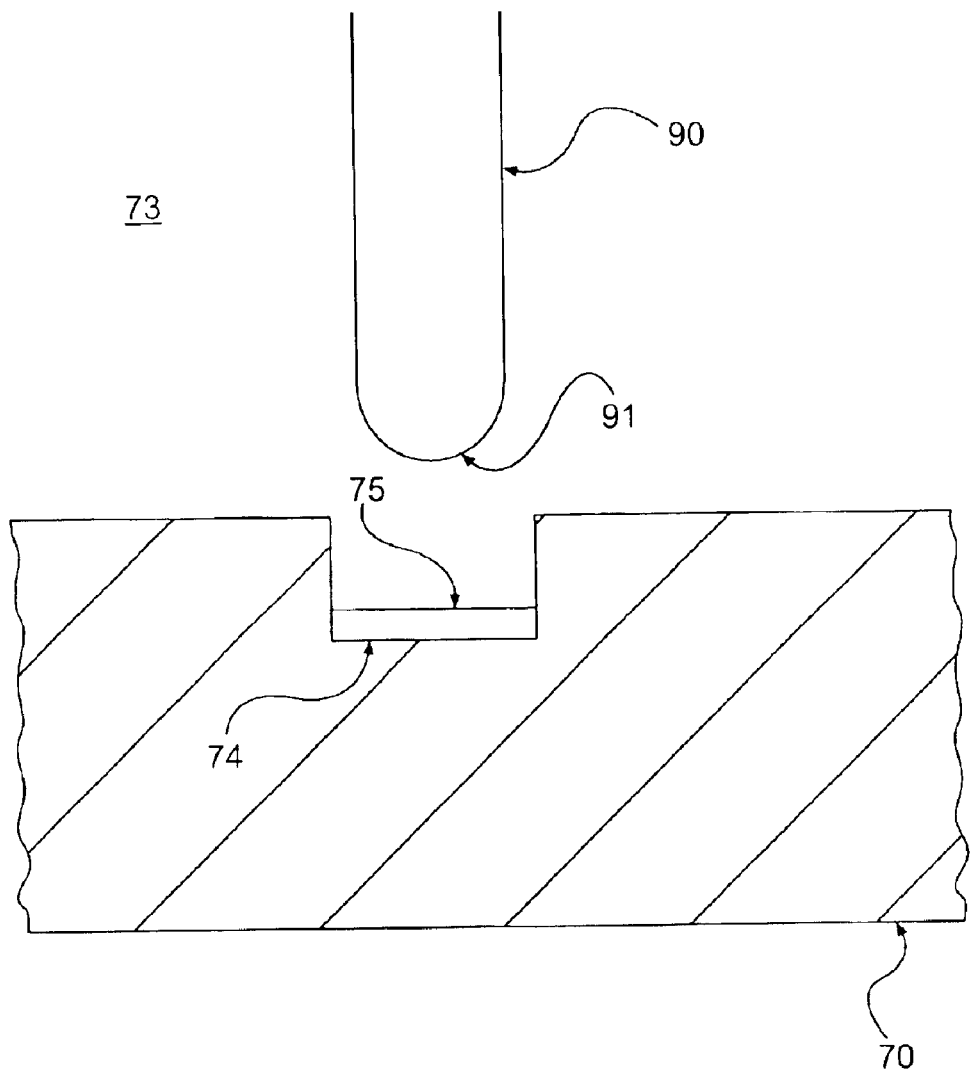
FIG. 3 is a diagram showing a sectional view of an opening in a heat sink of the modular integrated apparatus.

FIG. 3 is a diagram showing a sectional view of the opening 73 in the heat sink 70 in more detail. A counterbore 74 is located at a base of the opening 73 and comprises a hardened seat 75 at a base of the counterbore 74.

A load plate assembly 80 is set on top of the heat sink 70 and shuttled onto the load studs 60 through a plurality of holes 82 in the load plate assembly 80. The location of the holes 82 correspond to the location of the threaded sockets 46 in the bolster plate assembly 44. The holes 82 may be, for example, in the shape of key holes comprising a wide opening 84 and a narrow slot 85. The load plate assembly 80 may comprise, for example, one or more compression plates 86. The compression plates 86 are convex in shape and are oriented so that the outwardly curved surface of the compression plates 86 are directed toward the top of the heat sink 70. The load plate assembly 80 may be lowered onto the load studs 60 through the wide opening 84 of each hole 82 and then shuttled laterally so that the narrow slot 85 of each hole 82 is placed between the head 61 and the top shoulder 62 of each load stud 60. The load plate assembly also comprises a center hole 88 located directly above the seat 75. The center hole 88 may be, for example, a threaded rivet for receiving a threaded center load screw 90.

The center load screw 90 is inserted through the center hole 88 in the load plate assembly 80. The center load screw 90 comprises a head 92. The center load screw 90 is threaded into the center hole 88 by turning the center load screw 90 in a clock-wise direction for a right-hand screw, or in a counter-clock-wise direction for a left-hand screw. Upon turning the head 92 of the center load screw 90, the center load screw 90 moves downward toward the base of the opening 73 in the heat sink 70. The center load screw is prevented from moving further downward after a tip 91 of the center load screw 90 bears down on the seat 75. As the center load screw 90 is turned further after the tip 91 impacts the seat 75, a center of the convex compression plates 86 of the load plate assembly 80 is forced upward by the threaded interface of the center load screw 90 and the center hole 88. As the center of the compression plates 86 is forced upward upon continued turning of the center load screw 90, the outer edges of the compression plates 86 are also forced upward under the head 61 of each load stud 60. A tensile load is therefore applied to the load studs 60 because the load studs 60 are threaded into the sockets 46 of the bolster plate assembly 44. The tensile load is translated to the bolster plate assembly 44, pulling the bolster plate assembly 44 upward opposing the force of the center load screw 90 on the seat 75 on the heat sink 70. The result is that the processor stack 55 is compressed between the bolster plate assembly 44 and the heat sink 70. The compressive load ensures reliable electrical contact of the LGA socket 52 between the processor 20 and the circuit board 30.

As shown in FIG. 3, the tip 91 of the center load screw 90 may be, for example, spherical in shape. This design minimizes any torque imparted on the heat sink 70 by turning of the center load screw 90 after the tip 91 has impacted the seat 75. Excessive torque on the heat sink 70 may cause misalignment of the processor stack 55. The spherical shape of the tip 91 also minimizes metal debris that may result from the shear forces created as the tip 91 is turned on the surface of the seat 75. Metal debris may cause short circuiting problems within the modular integrated apparatus 10 as well as other portions of the computer system. Additionally, the center load screw 90 may be treated with a dry film lubricant to minimize torque and friction at the interface of the center load screw 90 and the center hole 88. Additionally, the center load screw 90 may be treated with a liquid lubricant, preferably having high dielectric properties, in addition to or instead of a dry film lubricant to further minimize torque and friction and reduce metal debris. Further, the seat 75 is hardened in order to prevent torque, friction and metal debris as the center load screw 90 bears down on the seat 75. The seat 75 may, for example, be comprised of stainless steel. The diameters of the counterbore 74 and the center load screw 90 may be sized to capture within the counterbore 74 any metal debris generated as the center load screw 90 bears down on the seat 75.

The center load screw 90 may be designed so that a predetermined number of turns of the head 92 of the center load screw 90 results in a desired compressive load. An operator may count the number of turns performed on the center load screw 90. The operator may count the number of turns manually or use a tool that assists in counting the number of turns. Alternately, a tool for turning the center load screw 90 may be programmed to automatically turn the center load screw 90 the predetermined number of turns to achieve the desired compressive load. This feature enables greater control over the load range to be applied to the processor stack 55 by eliminating stack tolerances of the components of the modular integrated apparatus 10. Load range reduction is important because excessive loading may result in deformation of the processor stack 55, the circuit board 30 and the bolster plate assembly 44. The opposing faces of the processor 20 and the circuit board 30 may not be parallel as a result of this deformation, thereby impairing socket and electrical function. Inadequate loading may result in an unreliable electrical connection between the LGA socket 52 and the circuit board 30.

Figure 4:
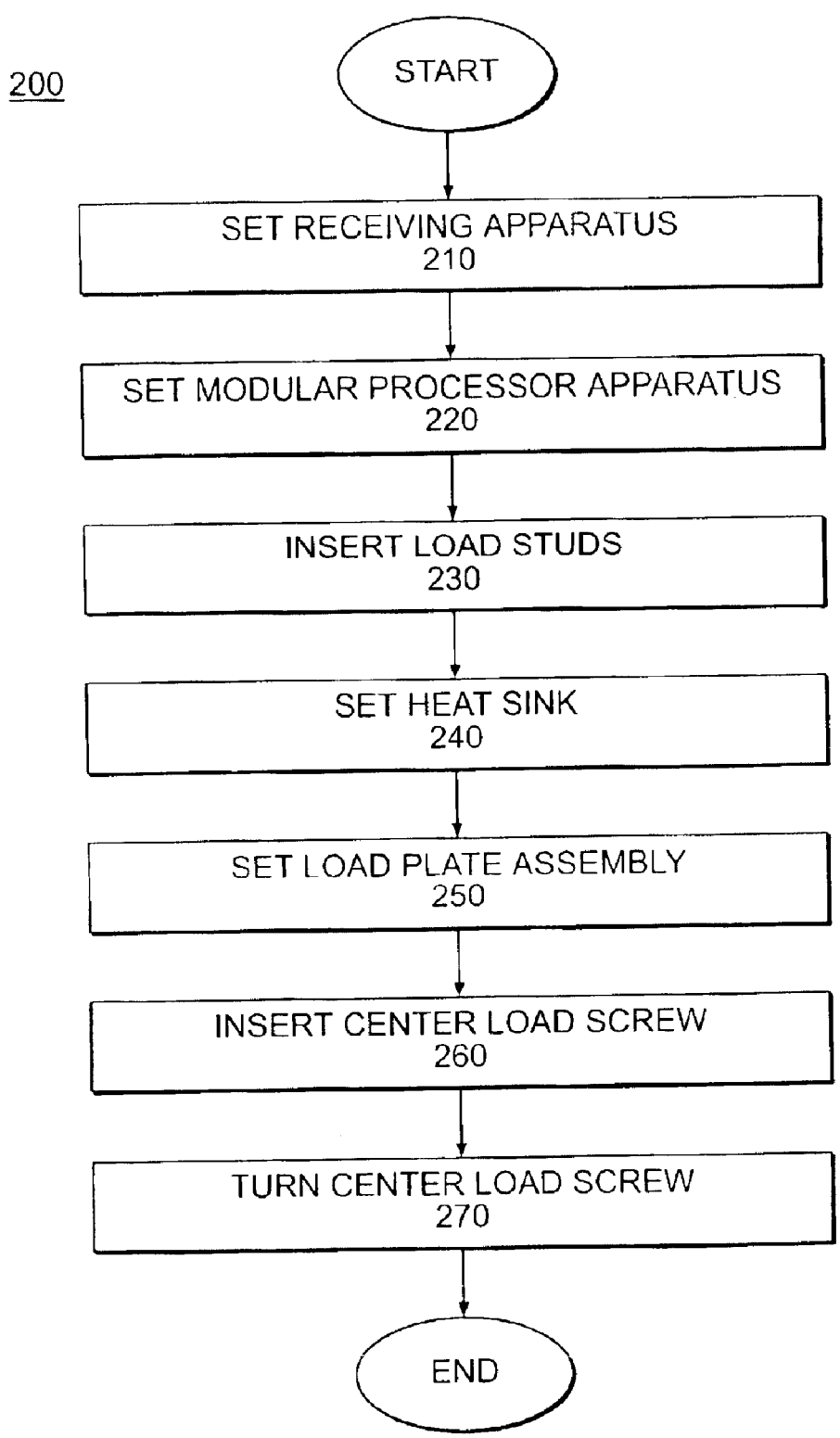
FIG. 4 shows a flowchart illustrating a method for land grid array (LGA) assembly using a compressive load.

FIG. 4 shows a flowchart 200 illustrating a method for applying compressive load in land grid array applications. In step 210, the receiving apparatus 40 is set on the bottom surface of the circuit board 30. In step 220, the modular processor apparatus 50 is set on the top surface of the circuit board 30 over the receiving apparatus 40. In step 230, the load studs 60 are inserted through the frame assembly 54 and the circuit board 30 and into the sockets 46 of the bolster plate assembly 44. In step 240, the heat sink 70 is set over the load studs 60. In step 250, the load plate assembly 80 is set on top of the heat sink 70, wherein the load plate assembly 80 is shuttled onto the load studs 60 through the holes 82 in the load plate assembly 80. In step 260, the center load screw 90 is inserted through the center hole 88 in the load plate assembly 80. In step 270, the center load screw 90 is turned, wherein the tip 91 of the center load screw 90 impacts the seat 75. As the center load screw 90 is turned further, the center of the convex compression plates 86 of the load plate assembly 80 is forced upward by the threaded interface of the center load screw 90 and the center hole 88. The outer edges of the compression plates 86 are also forced upward under the head 61 of each load stud 60, resulting in a tensile load applied to the load studs 60, which are threaded into the sockets 46 of the bolster plate assembly 44. The bolster plate assembly 44 is pulled upward opposing the force of the center load screw 90 on the seat 75 on the heat sink 70. The result is that the processor stack 55 is compressed between the bolster plate assembly 44 and the heat sink 70. The compressive load ensures reliable electrical contact of the LGA socket 52 between the processor 20 and the circuit board 30.

The use of the load plate assembly 80 in conjunction with the center load screw 90 to apply compressive load to the modular processor apparatus 50 enables an easy to use, high load implementation made up of fewer parts and resulting in lower operating costs than prior art devices. Compressive loads of more than 800 pounds may be achieved using a plurality of compression plates 86 in the load plate assembly 80. Additionally, a more compact footprint is created without significant intrusion into the thermal capacity of the heat sink 70 due to loss of fin area and air flow blockage. Further, the compressive load is applied in a single step without creating transverse loads that may interfere with the proper alignment or loading of the processor 20 to the LGA socket 52. Further, an evenly applied compressive load prevents damage to the LGA socket 52 and the processor 20, which may occur in LGA assemblies comprising coil spring assemblies. In such assemblies, damage to socket contacts or the processor may occur when the manufacturing process involved with the LGA assembly is not rigorously controlled. For example, one corner of a heat sink in the LGA assembly may be deflected excessively when one of the coil springs is tightened with too much force. High loads may be created when the opposite corner of the heat sink is deflected downward by tightening a corresponding coil spring in the LGA assembly. The high loads may cause the heat sink to pivot and damage the socket and/or the processor. Some sockets and processors that are made of a ceramic material, or are otherwise brittle, are especially vulnerable to this problem.

What is claimed is:

1. A land grid array (LGA) assembly using a compressive load comprising:
   a first component located on the top of the LGA assembly;
   a center load screw coupled to the first component;
   a second component, wherein the center load screw is received on the second component upon turning the center load screw in a first direction; and
   a receiving apparatus coupled to the first component using a plurality of load studs, wherein the second component is located between the first component and the receiving apparatus, wherein the first component comprises an outwardly curved surface, wherein a coupling of the center load screw and the first component is closer to the second component than a plurality of coupling of the plurality of load studs and the first component, and
   wherein further turning of the center load screw in the first direction after the center load screw is received on the second component forces a center of the first component upward and forces outer edges of the first component upward, thus creating a tensile load to the receiving apparatus and pulling the receiving apparatus upward opposing a force of the center load screw on the second component, thereby operates the first component to apply a compressive load on one or more of a plurality of components of the LGA assembly.

2. The LGA assembly of claim 1, further comprising:
   a circuit board, wherein the receiving apparatus positions a modular processor apparatus for connection of a processor to the circuit board;
   a modular processor apparatus comprising a processor;
   a heat sink, wherein the heat sink is located on top of and in contact with the modular processor apparatus, wherein the heat sink is the second component;

a load plate assembly, wherein the load plate assembly is located on top of the heat sink, wherein the load plate assembly is the first component; and a plurality of load studs, wherein the load studs attach the load plate assembly, the heat sink, the modular processor apparatus and the receiving apparatus to the circuit board.

3. The LGA assembly of claim 2, wherein the center load screw is inserted through a threaded center hole in the load plate assembly.

4. The LGA assembly of claim 2, wherein the receiving apparatus comprises:

an insulator, and a bolster plate assembly that attaches to the circuit board, wherein the insulator is located between the bolster plate assembly and the circuit board.

5. The LGA assembly of claim 2, wherein the modular processor apparatus further comprises:

a LGA socket, wherein the LGA socket enables electrical connection between the circuit board and the processor, wherein the processor is located on a top surface of the LGA socket, and a frame assembly that attaches to the circuit board, wherein the processor and LGA socket are located in the frame assembly, wherein the frame assembly and the LGA socket lie on a top surface of the circuit board.

6. The LGA assembly of claim 5 further comprising one or more gaskets, wherein the gasket and frame assembly attenuate electromagnetic interference generated by the processor.

7. The LGA assembly of claim 2 further comprising a thermal interface material located on a top face of the processor, wherein the thermal interface material enhances thermal conduction from the processor to the heat sink.

8. The LGA assembly of claim 2, wherein the load plate assembly comprises a plurality of compression plates, wherein the compression plates are convex in shape.

9. The LGA assembly of claim 2, wherein the load plate assembly comprises a plurality of holes, wherein each hole comprises a wide opening and a narrow slot.

10. The LGA assembly of claim 2, wherein the heat sink comprises a seat, wherein the center load screw is received on the seat.

11. The LGA assembly of claim 1, wherein a predetermined number of turns of the center load screw results in a desired compressive load.

12. The LGA assembly of claim 1, wherein the center load screw comprises a spherically shaped tip.

13. The LGA assembly of claim 1, wherein the center load screw is treated with a dry film lubricant to minimize torque and friction.

14. The LGA assembly of claim 1, wherein the center load screw is treated with a liquid lubricant to minimize torque and friction.

15. A method for land grid array (LGA) assembly using a compressive load, comprising the steps of:

setting a first component on the top of the LGA assembly;

coupling a center load screw to the first component;

setting a second component, wherein the center load screw is received on the second component upon turning the center load screw in a first direction;

coupling a receiving apparatus to the first component using a plurality of load studs, wherein the second component is located between the first component and the receiving apparatus, wherein the first component comprises an outwardly curved surface, wherein a coupling of the center load screw and the first component is closer to the second component than a plurality of coupling of the plurality of load studs and the first component; and turning the center load screw in the first direction, wherein the center load screw is received on the second component, a center of the first component is forced upward and outer edges of the first component are forced upward, thus creating a tensile load to the receiving apparatus and pulling the receiving apparatus upward opposing a force of the center load screw on the second component, thereby the first component is operated to apply a compressive load on one or more of a plurality of components of the LGA assembly.

16. The method of claim 15, further comprising:

setting the receiving apparatus on a bottom surface of a circuit board, wherein the receiving apparatus positions a modular processor apparatus for connection of a processor to the circuit board;

setting a modular processor apparatus on a top surface of the circuit board over the receiving apparatus, wherein the modular processor apparatus comprises a processor;

inserting a plurality of load studs through the modular processor apparatus and the circuit board and into the receiving apparatus;

setting a heat sink over the load studs, wherein the load studs are inserted through a plurality of holes in the heat sink, wherein the heat sink is in contact with the modular processor apparatus, wherein the heat sink is the second component; and setting a load plate assembly on top of the heat sink, wherein the load plate assembly is shuttled onto the load studs through a plurality of holes in the load plate assembly, wherein the load plate assembly is the first component.

17. The method claim 16, wherein the center load screw is inserted though a threaded center hole in the load plate assembly.

18. The method of claim 16, wherein the receiving apparatus comprises:

an insulator, and a bolster plate assembly that attaches to the circuit board, wherein the insulator is located between the bolster plate assembly and the circuit board, wherein the bolster plate assembly comprises a plurality of sockets.

19. The method of claim 16, wherein the modular processor apparatus further comprises:

a land grid array (LGA) socket, wherein the LGA socket enables electrical connection between the circuit board and the processor, wherein the processor is located on a top surface of the LGA socket, and a frame assembly that attaches to the circuit board, wherein the processor and LGA socket are located in the frame assembly, wherein the frame assembly and the LGA socket lie on a top surface of the circuit board, wherein the frame assembly and the circuit board comprise a plurality of holes.

20. The method of claim 16, wherein the load plate assembly comprises a plurality of compression plates, wherein the compression plates are convex in shape.

21. The method of claim 16, the heat sink comprises a seat, wherein the center load screw is received on the seat.

22. The method of claim 15, wherein the center load screw comprises a spherically shaped tip.

23. The method of claim 15, wherein a predetermined number of turns of the center load screw results in a desired compressive load.

* * * * *